United States Patent
Prakash et al.

(10) Patent No.: US 12,176,057 B2
(45) Date of Patent: Dec. 24, 2024

(54) SYSTEMS AND METHODS FOR MINIMIZING IDLE CHANNEL NOISE IN A SINGLE-ENDED AMPLIFIER

(71) Applicant: Cirrus Logic International Semiconductor Ltd., Edinburgh (GB)

(72) Inventors: Chandra B. Prakash, Austin, TX (US); Cory J. Peterson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 9 days.

(21) Appl. No.: 17/545,378

(22) Filed: Dec. 8, 2021

(65) Prior Publication Data
US 2023/0141666 A1 May 11, 2023

Related U.S. Application Data
(60) Provisional application No. 63/276,758, filed on Nov. 8, 2021.

(51) Int. Cl.
   *G11C 7/10* (2006.01)
   *H03K 19/003* (2006.01)
(52) U.S. Cl.
   CPC ...... *G11C 7/1057* (2013.01); *H03K 19/00361* (2013.01)
(58) Field of Classification Search
   CPC .................. G11C 7/1057; H03K 19/00361
   See application file for complete search history.

(56) References Cited

U.S. PATENT DOCUMENTS

| | | | | |
|---|---|---|---|---|
| 3,580,243 A | * | 5/1971 | Johnson | A61B 5/308 327/427 |
| 6,809,560 B1 | * | 10/2004 | Wrathall | H02M 3/1588 327/108 |
| 6,870,390 B1 | * | 3/2005 | Groen | H04L 25/028 327/170 |
| 10,209,774 B2 | * | 2/2019 | Billington | G06F 3/016 |
| 10,862,442 B2 | * | 12/2020 | He | H03F 3/45672 |
| 11,024,793 B1 | * | 6/2021 | Chaput | G01L 1/16 |
| 2005/0057274 A1 | * | 3/2005 | Groen | H03K 19/018514 326/27 |
| 2009/0140728 A1 | | 6/2009 | Rollins et al. | |

(Continued)

FOREIGN PATENT DOCUMENTS

| | | |
|---|---|---|
| GB | 2394295 A | 4/2004 |
| GB | 2586722 B | 2/2022 |

OTHER PUBLICATIONS

Second Office Action, China National Intellectual Property Administration, Application No. 201980022689.9, mailed Oct. 27, 2021.

(Continued)

*Primary Examiner* — Lincoln D Donovan
*Assistant Examiner* — James G Yeaman
(74) *Attorney, Agent, or Firm* — Jackson Walker L.L.P.

(57) ABSTRACT

In accordance with embodiments of the present disclosure, a system may include a driver configured to drive a load with a single-ended driving signal and a signal return path for the load, wherein the signal return path comprises a voltage-mode driver configured to create a signal offset during an idle channel mode of the system in order to minimize idle channel noise at the load.

30 Claims, 5 Drawing Sheets

(56) References Cited

U.S. PATENT DOCUMENTS

| | | | |
|---|---|---|---|
| 2015/0002278 A1* | 1/2015 | Shah | G08B 6/00 |
| | | | 340/407.1 |
| 2018/0019758 A1* | 1/2018 | Hsiao | H03F 3/3035 |
| 2021/0064137 A1 | 3/2021 | Wopat et al. | |
| 2021/0175831 A1* | 6/2021 | Chen | H02P 25/086 |
| 2021/0175852 A1* | 6/2021 | Clarkin | H03F 1/52 |
| 2021/0320590 A1* | 10/2021 | Ng | H02M 1/088 |
| 2021/0328535 A1* | 10/2021 | Khenkin | H02P 25/034 |
| 2021/0396610 A1 | 12/2021 | Li et al. | |
| 2021/0404901 A1 | 12/2021 | Kost et al. | |
| 2022/0029505 A1 | 1/2022 | Khenkin et al. | |

OTHER PUBLICATIONS

Second Office Action, China National Intellectual Property Administration, Application No. 201980022693.5, mailed Dec. 14, 2021.
Combined Search and Examination Report under Sections 17 and 18(3), UKIPO, Application No. GB2111666.0, mailed Feb. 11, 2022.
Examination Report under Section 18(3), UKIPO, Application No. GB2101804.9, mailed Feb. 25, 2022.
Definition of "Common-Mode Voltage", The New IEEE Standard Dictionary of Electrical and Electronics Terms, 5th Ed., p. 217 (1993).
International Search Report and Written Opinion of the International Searching Authority, International Application No. PCT/US2022/079036, mailed Feb. 22, 2023.

* cited by examiner

SYSTEMS AND METHODS FOR MINIMIZING IDLE CHANNEL NOISE IN A SINGLE-ENDED AMPLIFIER

RELATED APPLICATION

The present application claims priority to U.S. Prov. Pat. Appl. 63/276,758, filed Nov. 8, 2021, and which is incorporated by reference herein in its entirety.

FIELD OF DISCLOSURE

The present disclosure relates in general to methods, apparatuses, or implementations for haptic devices. Embodiments set forth herein may disclose improvements relating to how a physical quantity, such as inductance or displacement, of a haptic actuator or other electromechanical load may be sensed.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

Figure 1:
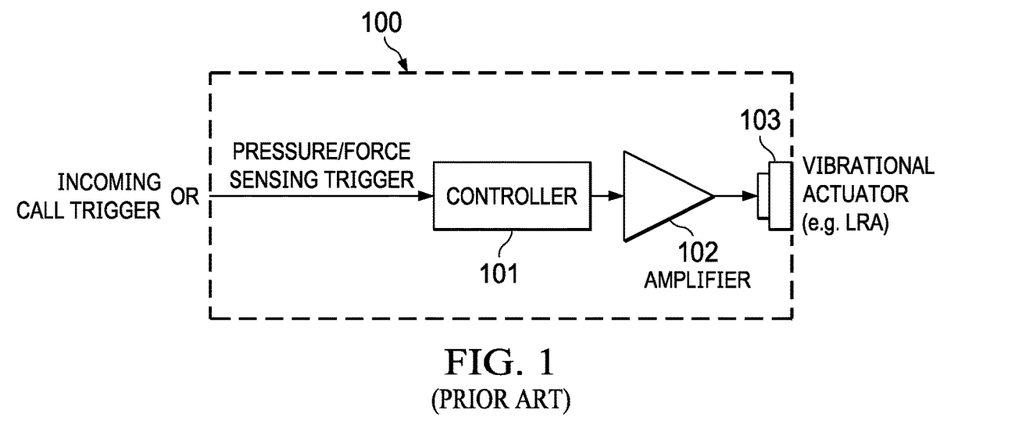
FIG. 1 illustrates an example of a vibro-haptic system in a device, as is known in the art.

FIG. 1 illustrates an example of a vibro-haptic system in a device 100. Device 100 may comprise a controller 101 configured to control a signal applied to an amplifier 102. Amplifier 102 may then drive a vibrational actuator (e.g., haptic transducer) 103 based on the signal. Controller 101 may be triggered by a trigger to output to the signal. The trigger may, for example, comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

Figure 2:
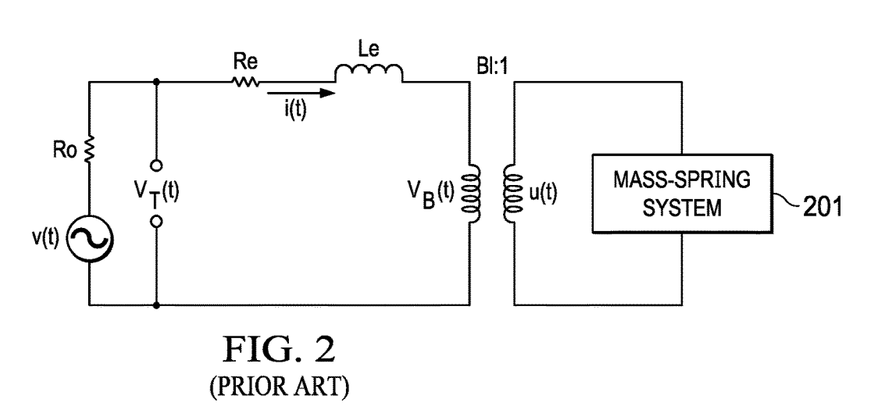
FIG. 2 illustrates an example of a Linear Resonant Actuator (LRA) modelled as a linear system, as is known in the art.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

A haptic system may require precise control of movements of the haptic transducer. Such control may rely on the magnetic force factor Bl, which may also be known as the electromagnetic transfer function of the haptic transducer. In an ideal case, magnetic force factor Bl can be given by the product B·l, where B is magnetic flux density and l is a total length of electrical conductor within a magnetic field. Both magnetic flux density B and length l should remain constant in an ideal case with motion occurring along a single axis.

In generating haptic vibration, an LRA may undergo displacement. In order to protect an LRA from damage, such displacement may be limited. Accordingly, accurate measurement of displacement may be crucial in optimizing LRA displacement protection algorithms Accurate measurement of displacement may also enable increased drive levels of the LRA. While existing approaches measure displacement, such approaches have disadvantages. For example, displacement may be measured using a Hall sensor, but Hall sensors are often costly to implement.

SUMMARY

In accordance with the teachings of the present disclosure, the disadvantages and problems associated with existing approaches for sensing displacement of an electromagnetic transducer may be reduced or eliminated.

In accordance with embodiments of the present disclosure, a system may include a driver configured to drive a load with a single-ended driving signal and a signal return path for the load, wherein the signal return path comprises a voltage-mode driver configured to create a signal offset during an idle channel mode of the system in order to minimize idle channel noise at the load.

In accordance with these and other embodiments of the present disclosure, a system configured to be coupled to an electromagnetic load may include a current-sensing circuit having a sense resistor coupled between a first terminal of the electromagnetic load and an electrical node driven to a common-mode voltage and a control circuit configured to, during a haptic mode of the system, couple a first terminal of the electromagnetic load to a ground voltage, and during a load sensing mode of the system for sensing a current associated with the electromagnetic load, couple the first terminal to the current-sensing circuit. The current-sensing circuit may be further configured to create a signal offset during an idle channel mode associated with the electromagnetic load in order to minimize idle channel noise at the load.

In accordance with these and other embodiments of the present disclosure, a system may include a driver configured to drive a load with a driving signal and a processing system configured to communicatively couple to the load and configured to, during a normal mode of the system, cause the driving signal to have a first slew rate, and during an idle channel mode of the system, cause the driving signal to have a second slew rate higher than the first slew rate.

In accordance with these and other embodiments of the present disclosure, a method may include driving a load with a single-ended driving signal and creating, with a voltage-mode driver of a signal return path for the load, a signal offset during an idle channel mode of the system in order to minimize idle channel noise at the load.

In accordance with these and other embodiments of the present disclosure, a method may be provided in a system configured to be coupled to an electromagnetic load and having a current-sensing circuit having a sense resistor coupled between a first terminal of the electromagnetic load and an electrical node driven to a common-mode voltage. The method may include, during a haptic mode of the system, coupling a first terminal of the electromagnetic load to a ground voltage. The method may also include, during a load sensing mode of the system for sensing a current associated with the electromagnetic load, coupling the first terminal to the current-sensing circuit. The method may further include creating, with the current-sensing circuit, a signal offset during an idle channel mode associated with the electromagnetic load in order to minimize idle channel noise at the load.

In accordance with these and other embodiments of the present disclosure, a method may include driving a load with a driving signal, during a normal mode of the system, causing the driving signal to have a first slew rate, and during an idle channel mode of the system, causing the driving signal to have a second slew rate higher than the first slew rate.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection-type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal may generally be an analog time varying voltage signal, for example, a time varying waveform.

To accurately sense displacement of an electromagnetic load, methods and systems of the present disclosure may determine an inductance of the electromagnetic load, and then convert the inductance to a position signal, as described in greater detail below. Further, to measure inductance of an electromagnetic load, methods and systems of the present disclosure may utilize either a phase measurement approach and/or a high-frequency pilot-tone driven approach, as also described in greater detail below.

To illustrate, an electromagnetic load may be driven by a driving signal $V(t)$ to generate a sensed terminal voltage $V_T(t)$ across a coil of the electromagnetic load. Sensed terminal voltage $V_T(t)$ may be given by:

$$V_T(t) = Z_{COIL} I(t) + V_B(t)$$

wherein I(t) is a sensed current through the electromagnetic load, $Z_{COIL}$, is an impedance of the electromagnetic load, and $V_B(t)$ is the back-electromotive force (back-EMF) associated with the electromagnetic load.

As used herein, to "drive" an electromagnetic load means to generate and communicate a driving signal to the electromagnetic load to cause displacement of a movable mass of the electromagnetic load.

Because back-EMF voltage $V_B(t)$ may be proportional to velocity of the moving mass of the electromagnetic load, back-EMF voltage $V_B(t)$ may in turn provide an estimate of such velocity. Thus, velocity of the moving mass may be recovered from sensed terminal voltage $V_T(t)$ and sensed current I(t) provided that either: (a) sensed current I(t) is equal to zero, in which case $V_B(t)=V_T(t)$; or (b) coil impedance $Z_{COIL}$ is known or is accurately estimated.

Position of the moving mass may be related to a coil inductance $L_{COIL}$ of the electromagnetic load. At high frequencies significantly above the bandwidth of the electromagnetic load, back-EMF voltage $V_B(t)$ may become negligible and inductance may dominate the coil impedance $Z_{COIL}$ Sensed terminal voltage $V_{T@HF}(t)$ at high frequencies may be estimated by:

$$V_{T@HF}(t)=Z_{COIL}I_{@HF}(t)$$

Hence, at high frequencies, the position of the moving mass of the electromagnetic load may be recovered from sensed terminal voltage $V_T(t)$ and sensed current I(t) by: (a) estimating the coil impedance at high frequency as $Z_{COIL@HF} \cong R_{@HF} L_{@HF} \cdot S$, where $R_{@HF}$ is the resistive part of the coil impedance at high frequency, $L_{@HF}$ is the coil inductance at high frequency, and s is the Laplace transform; and (b) converting the measured inductance to a position signal. Velocity and/or position may be used to control vibration of the moving mass of the electromagnetic load.

Figure 3:
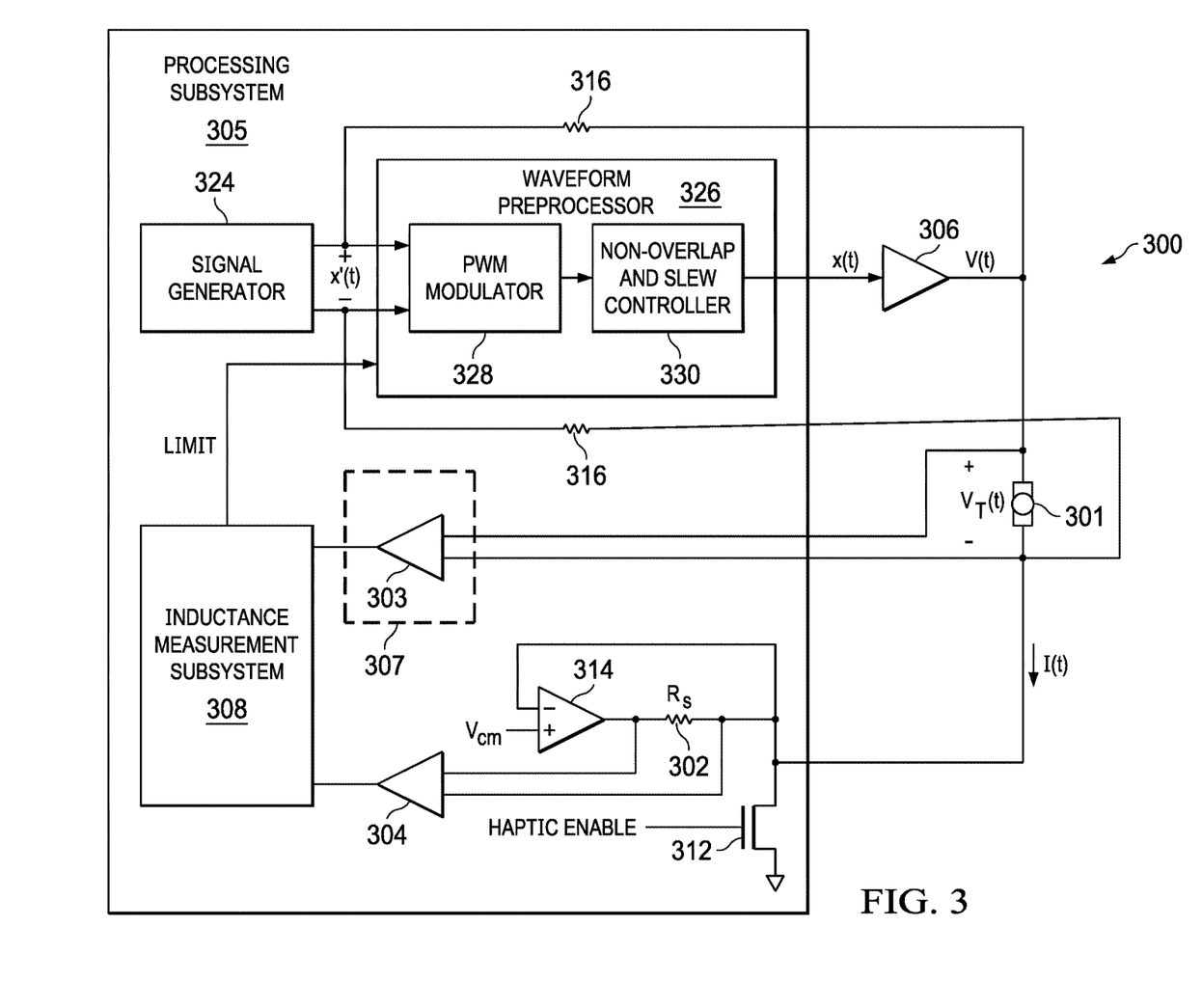
FIG. 3 illustrates selected components of an example host device, in accordance with embodiments of the present disclosure.

FIG. 3 illustrates selected components of an example host device 300 having an electromagnetic load 301, in accordance with embodiments of the present disclosure. Host device 300 may include, without limitation, a mobile device, home application, vehicle, and/or any other system, device, or apparatus that includes a human-machine interface. Electromagnetic load 301 may include any suitable load with a complex impedance, including without limitation a haptic transducer, a loudspeaker, a microspeaker, a piezoelectric transducer, a voice-coil actuator, a solenoid, or other suitable transducer.

In operation, a signal generator 324 of a processing subsystem 305 of host device 300 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 324. In some embodiments, raw transducer driving signal x'(t) may comprise a differential pulse-width modulated (PWM) signal.

Raw transducer driving signal x'(t) may be received by waveform preprocessor 326 which, as described in greater detail below, may modify or otherwise convert raw transducer driving signal x'(t) in order to generate processed transducer driving signal x(t). For example, waveform processor 326 may include a PWM modulator 328 and non-overlap and slew controller 330. PWM modulator 328 may include any suitable device, system, or apparatus configured to generate a single-ended PWM signal from raw transducer driving signal x'(t). For example, PWM modulator 328 may include a delta-sigma modulator comprising one or more integrator stages, a quantizer, and a conversion block configured to convert a differential signal into a single-ended signal. Accordingly, processed transducer driving signal x(t) may comprise a single-ended signal (e.g., a single-ended PWM signal) communicated to amplifier 306.

Processed transducer driving signal x(t) may in turn be amplified by amplifier 306 to generate a driving signal V (t) for driving electromagnetic load 301. Amplifier 306 may comprise a single-ended Class-D output stage (e.g., one half of an H-bridge). Responsive to driving signal V(t), a sensed terminal voltage $V_T(t)$ of electromagnetic load 301 may be sensed by a terminal voltage sensing block 307 of processing subsystem 305, for example a volt-meter, and converted to a digital representation by a first analog-to-digital converter (ADC) 303. As shown in FIG. 3, a feedback resistor 316 coupled to a terminal of electromagnetic load 301 may provide closed-loop feedback to the generation of processed transducer driving signal x(t).

Similarly, sensed current I(t) may be converted to a digital representation by a second ADC 304. Current I(t) may be sensed across a shunt resistor 302 having resistance $R_s$ coupled to a terminal of electromagnetic load 301. As shown in FIG. 3, ADC 304 and shunt resistor 302 may be part of a current-sensing circuit including a ground return transistor 312 and a common-mode buffer 314. During a haptics mode, when waveform preprocessor 326 drives a haptic waveform as processed transducer driving signal x(t), ground return transistor 312 may be enabled (e.g., on, closed, activated) and common-mode buffer 314 may be disabled (e.g., off, deactivated), thus coupling a terminal of electromagnetic load 301 to ground. On the other hand, during a load sensing mode, ground return transistor 312 may be disabled and common-mode buffer 314 may be enabled, thus coupling the same terminal of electromagnetic load 301 to a common-mode voltage $V_{CM}$. In the load sensing mode, waveform preprocessor 326 may drive a pilot tone or other signal suitable for measuring driving signal V(t) and sensed current I(t) in order to determine an impedance (e.g., resistance and inductance) of electromagnetic load 301, wherein a component of such impedance (e.g., inductance) may be representative of a displacement of electromagnetic load 301.

As shown in FIG. 3, processing subsystem 305 may include an inductance measurement subsystem 308 that may estimate coil inductance $L_{COIL}$ of electromagnetic load 301. From such estimated coil inductance $L_{COIL}$ inductance measurement subsystem 308 may determine a displacement associated with electromagnetic load 301. If such displacement exceeds a threshold, high-frequency pilot-tone driven inductance measurement subsystem 308 may communicate a limiting signal (indicated by "LIMIT" in FIG. 3) to modify raw transducer driving signal x'(t) in a manner that prevents over-excursion in the displacement of electromagnetic load 301.

In operation, to estimate impedance $Z_{COIL}$ inductance measurement subsystem 308 may measure impedance in any suitable manner, including without limitation using the approaches set forth in U.S. patent application Ser. No. 17/497,110 filed Oct. 8, 2021, which is incorporated in its entirety by reference herein.

One disadvantage of the architecture shown in FIG. 3 is that it may generate perceptible noise on driving signal V(t) even when raw transducer driving signal x'(t) is zero (known as "idle channel noise") due to a deadzone in the transfer function of waveform preprocessor 326. A noise gate could be used to reduce or eliminate such disadvantage, but the addition of a noise gate may negatively impact performance elsewhere in host device 300. Another possible solution may be to add a small direct-current offset within the signal path of raw transducer driving signal x'(t) and driving signal V(t), but such a solution does not generate a true idle channel condition.

Figure 4:
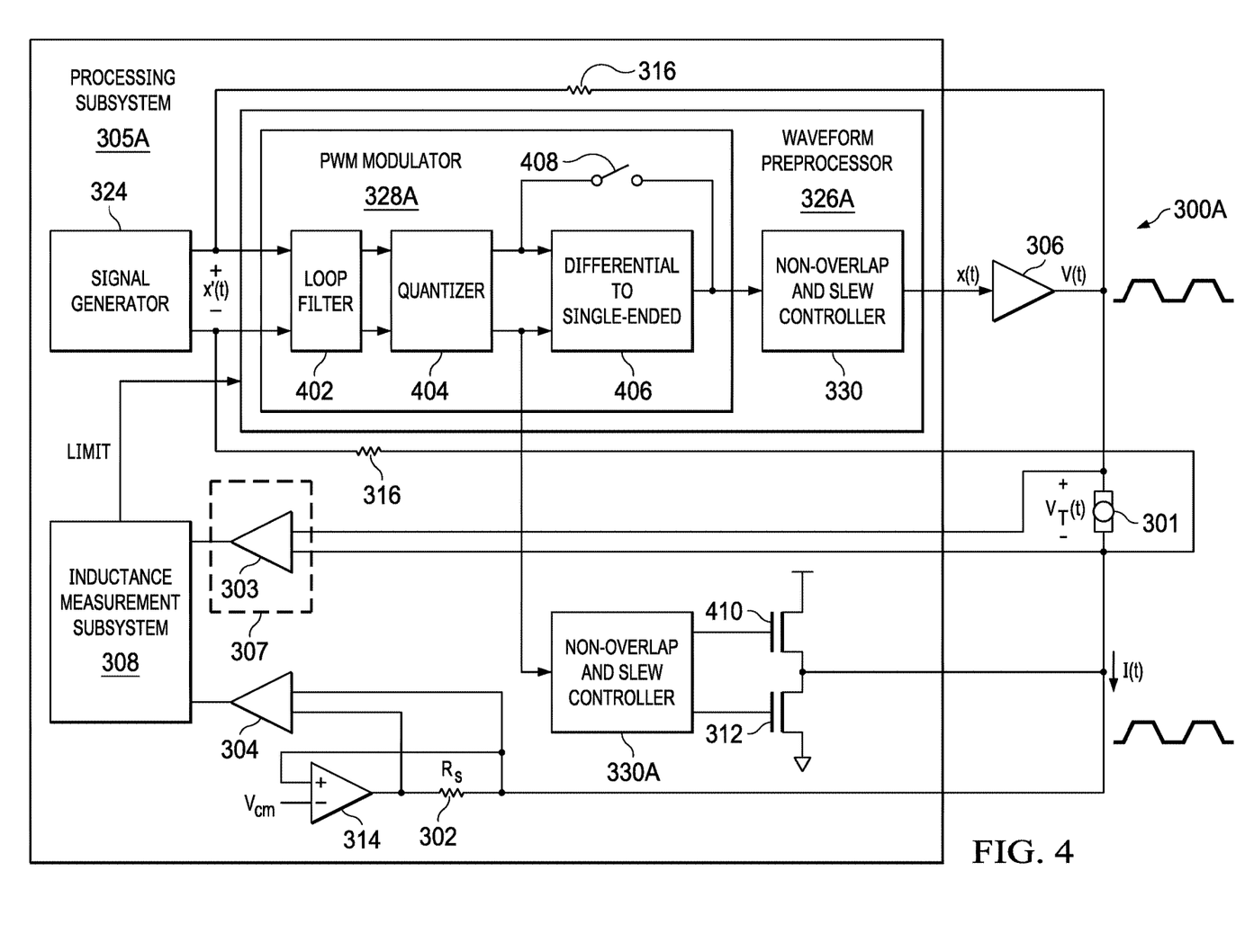
FIG. 4 illustrates selected components of another example host device, in accordance with embodiments of the present disclosure.
Figure 5:
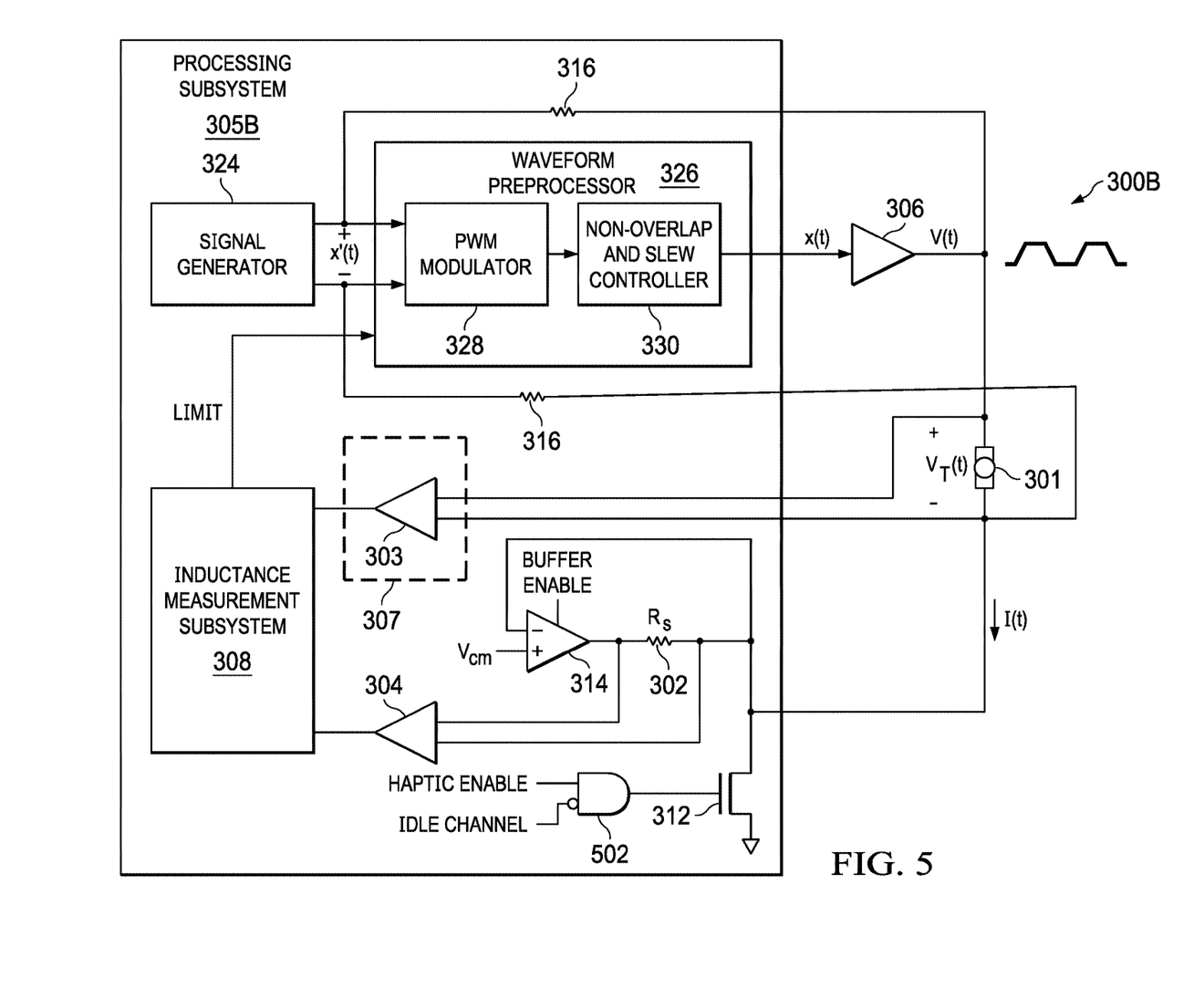
FIG. 5 illustrates selected components of yet another example host device, in accordance with embodiments of the present disclosure.
Figure 6:
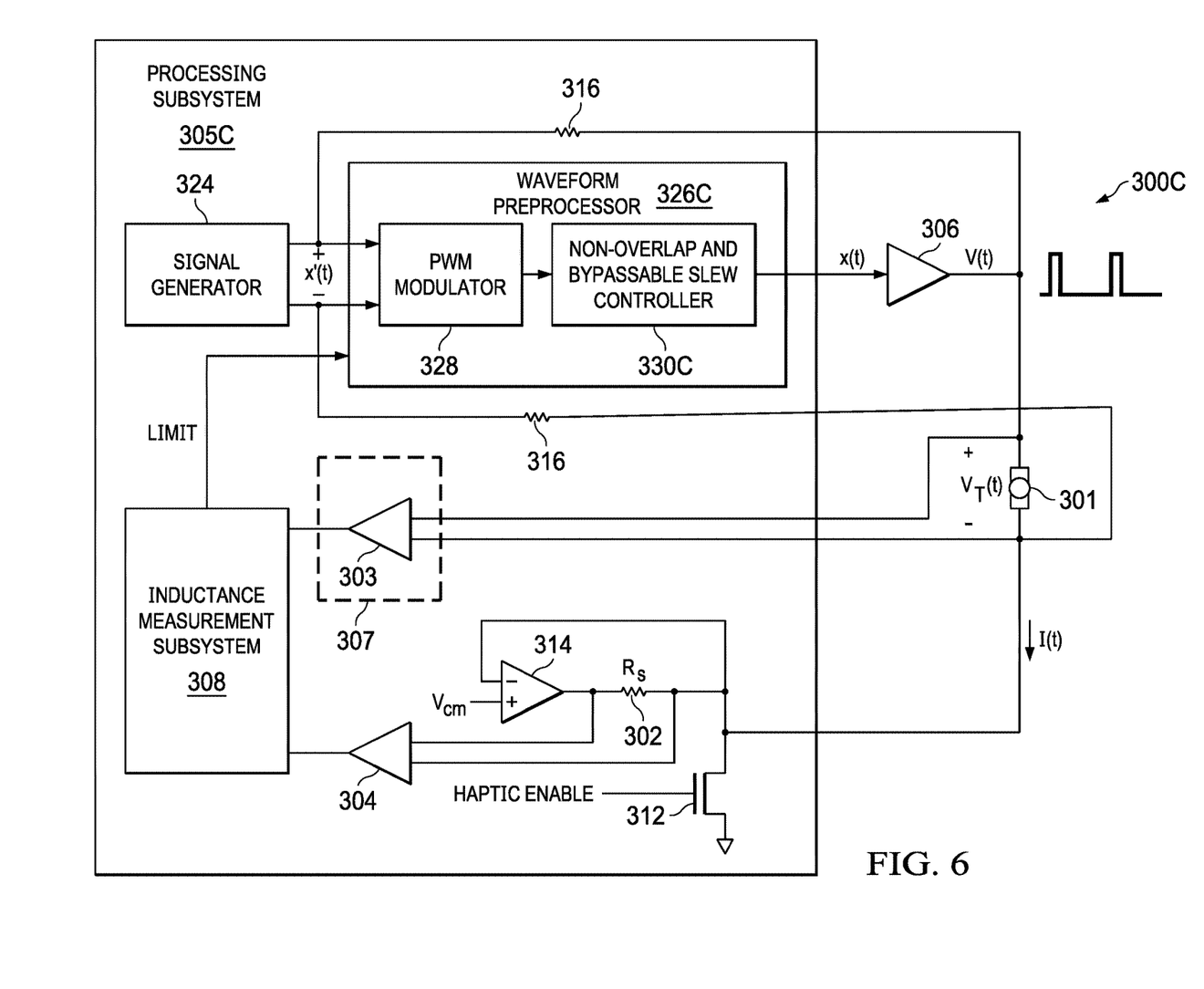
FIG. 6 illustrates selected components of yet another example host device, in accordance with embodiments of the present disclosure.

To overcome such disadvantages, further improvements may be made to the architecture shown in FIG. 3, as illustrated in FIGS. 4-6 and described below.

FIG. 4 illustrates selected components of another example host device 300A, in accordance with embodiments of the present disclosure. Host device 300A as shown in FIG. 4 may be similar in many respects to host device 300 shown in FIG. 3, so only certain differences between host device 300A and host device 300 may be set forth below. Further, processing subsystem 305A as shown in FIG. 4 may be similar in many respects to processing subsystem 305 shown in FIG. 3, so only certain differences between processing subsystem 305A and processing subsystem 305 may be set forth below. Moreover, waveform preprocessor 326A as shown in FIG. 4 may be similar in many respects to waveform preprocessor 326 shown in FIG. 3, so only certain differences between waveform preprocessor 326A and waveform preprocessor 326 may be set forth below. Additionally, PWM modulator 328A as shown in FIG. 4 may be similar in many respects to PWM modulator 328 shown in FIG. 3, so only certain differences between PWM modulator 328A and PWM modulator 328A may be set forth below.

As is shown in FIG. 4, PWM modulator 328 may include a loop filter 402, quantizer 404, and a differential to single-ended conversion block 406. Although not explicitly depicted in FIG. 3, 5, or 6, PWM modulators 328 of host device 300, host device 300B (FIG. 5), and host device 300C (FIG. 6) may also include loop filter 402, quantizer 404, and a differential to single-ended conversion block 406. Loop filters, quantizers, and differential to single-ended conversion blocks are well-known in the art, and thus are not described here in detail.

As further shown in FIG. 4, PWM modulator 328 may also include a bypass switch 408. In operation, when host device 300A enters an idle channel mode, which may occur when the magnitude of raw transducer driving signal x'(t) is below a threshold magnitude, bypass switch 408 may be activated (e.g., closed, on, enabled), thus bypassing the positive polarity of the differential output of quantizer 404 to non-overlap and slew controller 330. The resulting bypassed signal may be used to generate processed transducer driving signal x(t) and driving signal V(t) for driving a first terminal of electromagnetic load 301.

In addition, a weak high-side transistor 410 (e.g., a p-type field-effect transistor) with a driver strength significantly weaker than a driver strength of a corresponding high-side transistor of amplifier 306 may be coupled to ground return transistor 312 and arranged such that high-side transistor 410 and ground return transistor 312 form a second driver, analogous to amplifier 306, for driving a second terminal of electromagnetic load 301. The driver formed by high-side transistor 410 and ground return transistor 312 may itself be driven by a non-overlap and slew controller 330A which may be similar or identical to non-overlap and slew controller 330. Non-overlap and slew controller 330A may receive and process the negative polarity of the differential output of quantizer 404.

Accordingly, when host device 300A enters the idle channel mode, processing subsystem 305A may be configured to bypass differential to single-ended block 406 such that high-side transistor 410 and ground return transistor 312 may be driven as a second driver pair of a differential amplifier. As a result, quantizer 404 may generate a 50% duty cycle waveform during the idle channel mode, resulting in identical signals being driven to both terminals of electromagnetic load 301, thus reducing or eliminating idle channel noise.

FIG. 5 illustrates selected components of another example host device 300B, in accordance with embodiments of the present disclosure. Host device 300B as shown in FIG. 5 may be similar in many respects to host device 300 shown in FIG. 3, so only certain differences between host device 300B and host device 300 may be set forth below. Further, processing subsystem 305B as shown in FIG. 5 may be similar in many respects to processing subsystem 305 shown in FIG. 3, so only certain differences between processing subsystem 305A and processing subsystem 305 may be set forth below.

As shown in FIG. 5, processing subsystem 305B may implement a logical AND gate 502, such that ground return transistor 312 may be activated, and thus couples a terminal of electromagnetic load 301 to ground, when the haptics mode is enabled and when idle channel mode is disabled (e.g., raw transducer driving signal x'(t) is above a threshold magnitude). Otherwise, ground return transistor 312 may be deactivated. Further, during the idle channel mode (e.g., raw transducer driving signal x'(t) is below the threshold magnitude) and during the load sensing mode, common-mode buffer 314 may be activated by way of a buffer enable control signal. During the idle channel mode, common-mode buffer 314 may set a common-mode voltage at the terminals of electromagnetic load 301 which may act to reduce output noise during the idle channel mode.

Notably, in host device 300A and host device 300B, a voltage-mode driver in a return path of the signal path is used to create a signal offset when in the idle channel mode. In host device 300A, such voltage-mode driver is the driver formed by high-side transistor 410 and ground return transistor 312, while in host device 300B, such voltage-mode driver is formed by common-mode buffer 314. Such signal offset may minimize idle channel noise.

FIG. 6 illustrates selected components of another example host device, in accordance with embodiments of the present disclosure. Host device 300C as shown in FIG. 6 may be similar in many respects to host device 300 shown in FIG. 3, so only certain differences between host device 300C and host device 300 may be set forth below. Further, processing subsystem 305C as shown in FIG. 6 may be similar in many respects to processing subsystem 305 shown in FIG. 3, so only certain differences between processing subsystem 305C and processing subsystem 305 may be set forth below. Additionally, waveform preprocessor 326C as shown in FIG. 6 may be similar in many respects to waveform preprocessor 326 shown in FIG. 3, so only certain differences between waveform preprocessor 326C and waveform preprocessor 326 may be set forth below.

As shown in FIG. 6, waveform preprocessor 326C may include a non-overlap and bypassable slew controller 330C in lieu of non-overlap and slew controller 330 of FIG. 3. As its name suggests, in the idle channel mode of host device 300C (e.g., raw transducer driving signal x'(t) is below a threshold magnitude), non-overlap and bypassable slew controller 330C may be configured to bypass slew rate control logic (or alternatively, use a maximum slew rate setting) for controlling slew rates of amplifier 306. As a result, amplifier 306 may drive narrow pulses to electromagnetic load 301 which may be imperceptible to a user, and such narrow pulses may not have enough energy to cause the electromagnetic radiation that non-overlap and bypassable slew controller 330C serves to avoid.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
   a driver configured to drive a load with a single-ended driving signal; and
   a signal return path for the load, wherein the signal return path comprises a voltage-mode driver configured to create a signal offset during an idle channel mode of the system in order to minimize idle channel noise at the load wherein the idle channel mode occurs when a magnitude of the single-ended driving signal is below a threshold magnitude.

2. The system of claim 1, wherein the voltage-mode driver comprises a second driver that includes a ground-return transistor of load sensing circuitry for sensing one or more parameters associated with the load.

3. The system of claim 1, wherein the voltage-mode driver comprises a common-mode voltage buffer of load sensing circuitry for sensing one or more parameters associated with the load.

4. The system of claim 1, wherein the load is an electromagnetic load.

5. The system of claim 1, wherein the load is a haptic actuator.

6. A system configured to be coupled to an electromagnetic load and comprising:
   a current-sensing circuit having a sense resistor coupled between a first terminal of the electromagnetic load and an electrical node driven to a common-mode voltage; and
   a control circuit configured to:
      during a haptic mode of the system, couple a first terminal of the electromagnetic load to a ground voltage; and
      during a load sensing mode of the system, couple the first terminal to the current-sensing circuit and drive a signal suitable for sensing a current associated with the electromagnetic load;
   wherein the current-sensing circuit is further configured to create a signal offset during an idle channel mode associated with the electromagnetic load in order to minimize idle channel noise at the load wherein the idle channel mode occurs when a magnitude of a single-ended driving signal is below a threshold magnitude.

7. The system of claim 6, wherein the current-sensing circuit comprises a voltage-mode driver configured to create the signal offset during an idle channel mode of the system in order to minimize idle channel noise at the load.

8. The system of claim 7, wherein the voltage-mode driver comprises a second driver that includes a ground-return transistor of the current-sensing circuit.

9. The system of claim 7, wherein the voltage-mode driver comprises a common-mode voltage buffer of the current-sensing circuit.

10. The system of claim 6, wherein the load is an electromagnetic load.

11. The system of claim 6, wherein the load is a haptic actuator.

12. A system comprising:
    a driver configured to drive a load with a driving signal; and
    a processing system configured to communicatively couple to the load and configured to:
       during a normal mode of the system, cause the driving signal to have a first slew rate; and
       during an idle channel mode of the system, cause the driving signal to have a second slew rate higher than the first slew rate wherein the processing system is configured to cause the driving signal to have a second slew rate higher than the first slew rate by bypassing slew rate controls in a signal path of the driver.

13. The system of claim 12, wherein the driver is a single-ended driver.

14. The system of claim 12, wherein the load is an electromagnetic load.

15. The system of claim 12, wherein the load is a haptic actuator.

16. A method comprising:
driving a load with a single-ended driving signal; and
creating, with a voltage-mode driver of a signal return path for the load, a signal offset during an idle channel mode of a system for generating the single-ended driving signal in order to minimize idle channel noise at the load wherein the idle channel mode occurs when a magnitude of the single-ended driving signal is below a threshold magnitude.

17. The method of claim 16, wherein the voltage-mode driver comprises a second driver that includes a ground-return transistor of load sensing circuitry for sensing one or more parameters associated with the load.

18. The method of claim 16, wherein the voltage-mode driver comprises a common-mode voltage buffer of load sensing circuitry for sensing one or more parameters associated with the load.

19. The method of claim 16, wherein the load is an electromagnetic load.

20. The method of claim 16, wherein the load is a haptic actuator.

21. A method, in a system configured to be coupled to an electromagnetic load and having a current-sensing circuit having a sense resistor coupled between a first terminal of the electromagnetic load and an electrical node driven to a common-mode voltage, the method comprising:
during a haptic mode of the system, coupling a first terminal of the electromagnetic load to a ground voltage;
during a load sensing mode of the system, coupling the first terminal to the current-sensing circuit and driving a signal suitable for sensing a current associated with the electromagnetic load; and
creating, with the current-sensing circuit, a signal offset during an idle channel mode associated with the electromagnetic load in order to minimize idle channel noise at the load wherein the idle channel mode occurs when a magnitude of a single-ended driving signal is below a threshold magnitude.

22. The method of claim 21, further comprising, creating, with a voltage-mode driver of the current-sensing circuit, the signal offset during an idle channel mode of the system in order to minimize idle channel noise at the load.

23. The method of claim 22, wherein the voltage-mode driver comprises a second driver that includes a ground-return transistor of the current-sensing circuit.

24. The method of claim 22, wherein the voltage-mode driver comprises a common-mode voltage buffer of the current-sensing circuit.

25. The method of claim 21, wherein the load is an electromagnetic load.

26. The method of claim 21, wherein the load is a haptic actuator.

27. A method comprising:
driving a load with a driving signal;
during a normal mode of a system for driving the driving signal, causing the driving signal to have a first slew rate; and
during an idle channel mode of the system, causing the driving signal to have a second slew rate higher than the first slew rate further comprising causing the driving signal to have a second slew rate higher than the first slew rate by bypassing slew rate controls in a signal path of the driver.

28. The method of claim 27, wherein driving signal is driven with single-ended driver.

29. The method of claim 27, wherein the load is an electromagnetic load.

30. The method of claim 27, wherein the load is a haptic actuator.

* * * * *